United States Patent [19]

Grabbe

[11] Patent Number: 5,669,774

[45] Date of Patent: Sep. 23, 1997

[54] BALL GRID ARRAY SOCKET

[76] Inventor: Dimitry Grabbe, 2160 Rosedale Ave., Middletown, Pa. 17057

[21] Appl. No.: 614,885

[22] Filed: Mar. 13, 1996

Related U.S. Application Data

[63] Continuation-in-part of Ser. No. 301,368, Sep. 6, 1994, abandoned.

[51] Int. Cl.[6] .................................................. H01R 9/09
[52] U.S. Cl. ............................................. 439/70; 439/853
[58] Field of Search ............................... 439/68, 69, 71, 439/70, 751, 853, 733, 857

[56] References Cited

U.S. PATENT DOCUMENTS

| | | | |
|---|---|---|---|
| 3,676,838 | 7/1972 | Hartz et al. | 439/857 |
| 4,036,549 | 7/1977 | Honda et al. | 339/275 |
| 4,068,917 | 1/1978 | Seidler | 339/258 R |
| 5,076,794 | 12/1991 | Ganthier | 439/70 |
| 5,376,010 | 12/1994 | Petersen | 439/71 |
| 5,376,012 | 12/1994 | Clark | 439/857 |
| 5,418,471 | 5/1995 | Kardos | 324/758 |
| 5,419,710 | 5/1995 | Pfaff | 439/266 |
| 5,449,301 | 9/1995 | Hanna et al. | 439/510 |
| 5,453,016 | 9/1995 | Clark et al. | 439/79 |
| 5,498,970 | 3/1996 | Petersen | 439/261 |

*Primary Examiner*—Neil Abrams
*Assistant Examiner*—T. C. Patel

[57] ABSTRACT

A substrate mating assembly has a first substrate with at least one socket mounted thereon. The at least one socket has contact retention points provided thereon which extend into a contact receiving opening thereof. A second substrate is provided with at least one mating contact mounted thereon. The at least one mating contact has an arcuate surface and is dimensioned to be received in the contact receiving opening of the at least one socket. As the first substrate and the second substrate are electrically mated together, the at least one mating contact is received in the contact receiving opening and maintained in position therein by the cooperation of the contact retention points with the arcuate surface of the at least one mating contact. The contact retention points are provided on resilient arms which are configured to allow for the elastic distortion thereof as the at least one mating contact is brought into engagement with the at least one socket, such that when the at least one mating contact is fully inserted, the resilient arms will return toward an unstressed position to cooperate with the arcuate surface of the at least one mating contact to maintain the at least one mating contact in position.

29 Claims, 11 Drawing Sheets

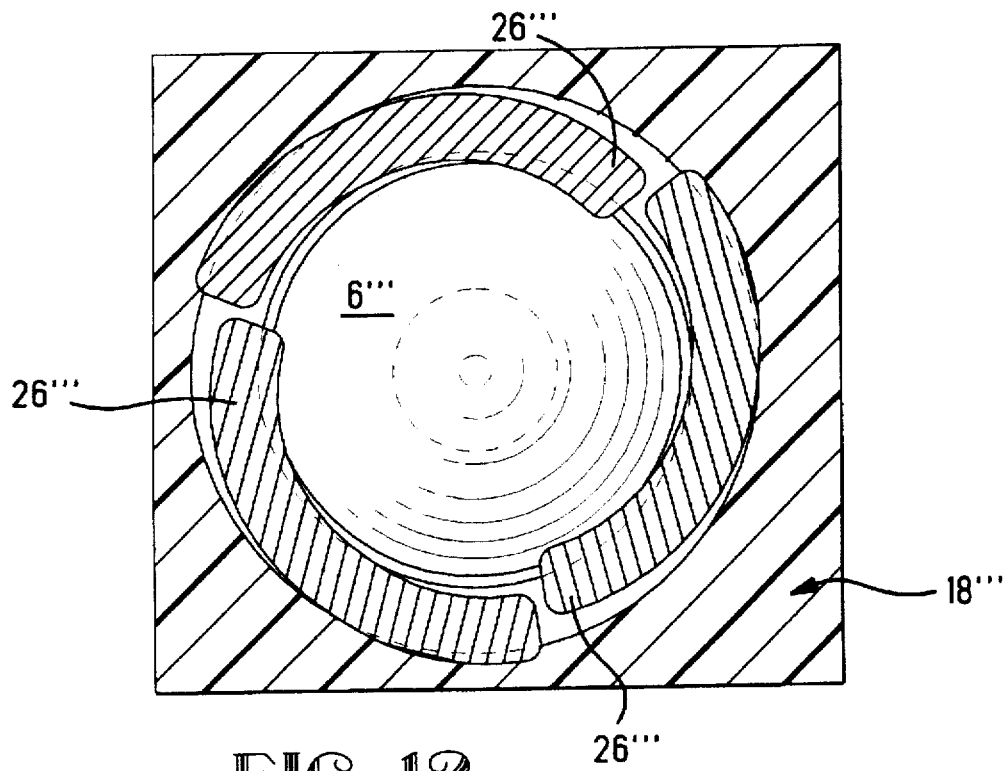
FIG. 12
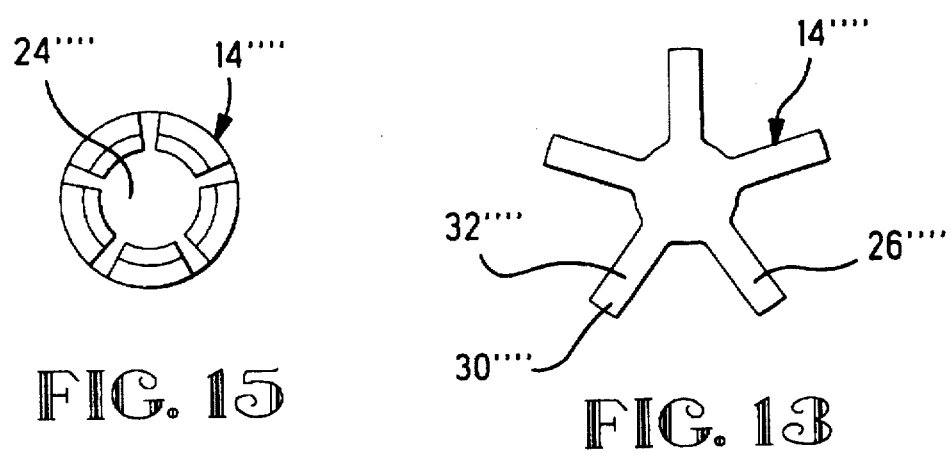
FIG. 15
FIG. 13
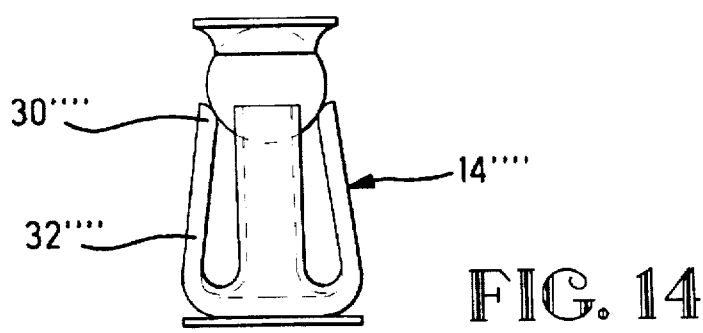
FIG. 14

BALL GRID ARRAY SOCKET

This application is a continuation-in-part of application Ser. No. 08/301,368 filed Sep. 6, 1994 now abandoned.

FIELD OF THE INVENTION

The invention is directed to a ball contact assembly. In particular, the invention is directed to a socket which cooperates with ball contacts to allow for the mating and unmating of a ceramic substrate or the like from a printed circuit board or the like over many cycles.

BACKGROUND OF THE INVENTION

As the complexity of integrated circuit packages continues to increase, it becomes more difficult to adequately position the leads around the perimeter of the integrated circuit package without increasing the overall size of the integrated circuit package. Although packages with leads spaced on centers as fine as 0.3 millimeters (0.012 inches) are currently being marketed, the benefits of the resulting increase in packaging efficiency are offset by decreased assembly yields and increased assembly process complexity, both adding to system cost. Therefor, in order to increase the number of leads while maintaining the size of the integrated circuit package, it has become necessary to have packages with high numbers of connections arranged in a grid, or array, on the surface of the package. One such solution is shown in the article entitled "Attachment of Solder Ball Connect (SBC) Packages to Circuit Boards" published in *IBM Journal of Research and Development*, Volume 37 Number 5, dated Sep. 19, 1993.

Although the technology shown in the above referenced article provides solutions to density and size, it does not allow for the removal of the ceramic substrate from a circuit board. As shown in FIG. 2, page 598, the ceramic substrate and circuit board are joined to the balls by eutectic soldered joints. As the balls are joined to both the substrate and the circuit board by way of soldered joints, a permanent connection is established and it is therefor difficult to repair and replace the substrate if a problem occurs. As the electrical connection between the substrate and the circuit board requires solder, testing of the substrate prior to installation is difficult and expensive. It would therefore be advantageous, to provide an interconnection between the ceramic substrate and the circuit board which allows for numerous cycles of mating and unmating to facilitate testing and repair thereof.

SUMMARY OF THE INVENTION

The invention is directed to a device which provides a "pin and socket" type connection between a first substrate and a second substrate. The socket is for mating with a mating contact such as a ball contact. The socket contact has a bottom wall and a side wall which extends from the bottom wall in a direction essentially perpendicular to the bottom wall. The side wall forms an opening into which the mating ball contact is inserted. Contact retention points are provided on the side wall and extend into the opening. The contact retention points cooperate with the ball contact to provide the electrical connection between the ball contact and the socket contact.

The invention is also directed to a socket assembly having the socket contact described above in combination with the mating ball contact whereby as the first substrate and the second substrate are mated together, the mating ball contact will be received in the opening of the socket contact and retained therein by the contact retention points.

The invention is also directed to a substrate mating assembly with a first substrate with at least one socket contact mounted thereon. The at least one socket contact has contact retention points provided thereon which extend into a contact receiving opening thereof. A second substrate is provided with at least one mating ball contact mounted thereon. The at least one mating ball contact has an arcuate surface and is dimensioned to be received in the contact receiving opening of the at least one socket contact. As the first substrate and the second substrate are electrically mated together, the at least one mating ball contact is received in the contact receiving opening and maintained in position therein by the cooperation of the contact retention points with the arcuate surface of the at least one mating ball contact. The contact retention points are provided on resilient arms which are configured to allow for the elastic deformation thereof as the at least one mating ball contact is brought into engagement with the at least one socket contact, such that when the at least one mating ball contact is fully inserted, the resilient arms will partially return toward an unstressed position to cooperate with the surface Of the at least one mating ball contact to maintain the at least one mating ball contact in position.

BRIEF DESCRIPTION OF THE DRAWINGS

FIG. 12 is a cross sectional view, taken along line 12—12 of FIG. 11, showing the resilient arms of the third alternate socket contact in engagement with the ball.

FIG. 13 is a plan view of a stamped metal blank to be formed into a fourth alternate socket contact.

FIG. 14 shows a side view of the fourth alternate socket contact of FIG. 13 after forming.

FIG. 15 shows a top view of the fourth alternate socket contact of FIG. 14.

DESCRIPTION OF THE INVENTION

Figure 1:
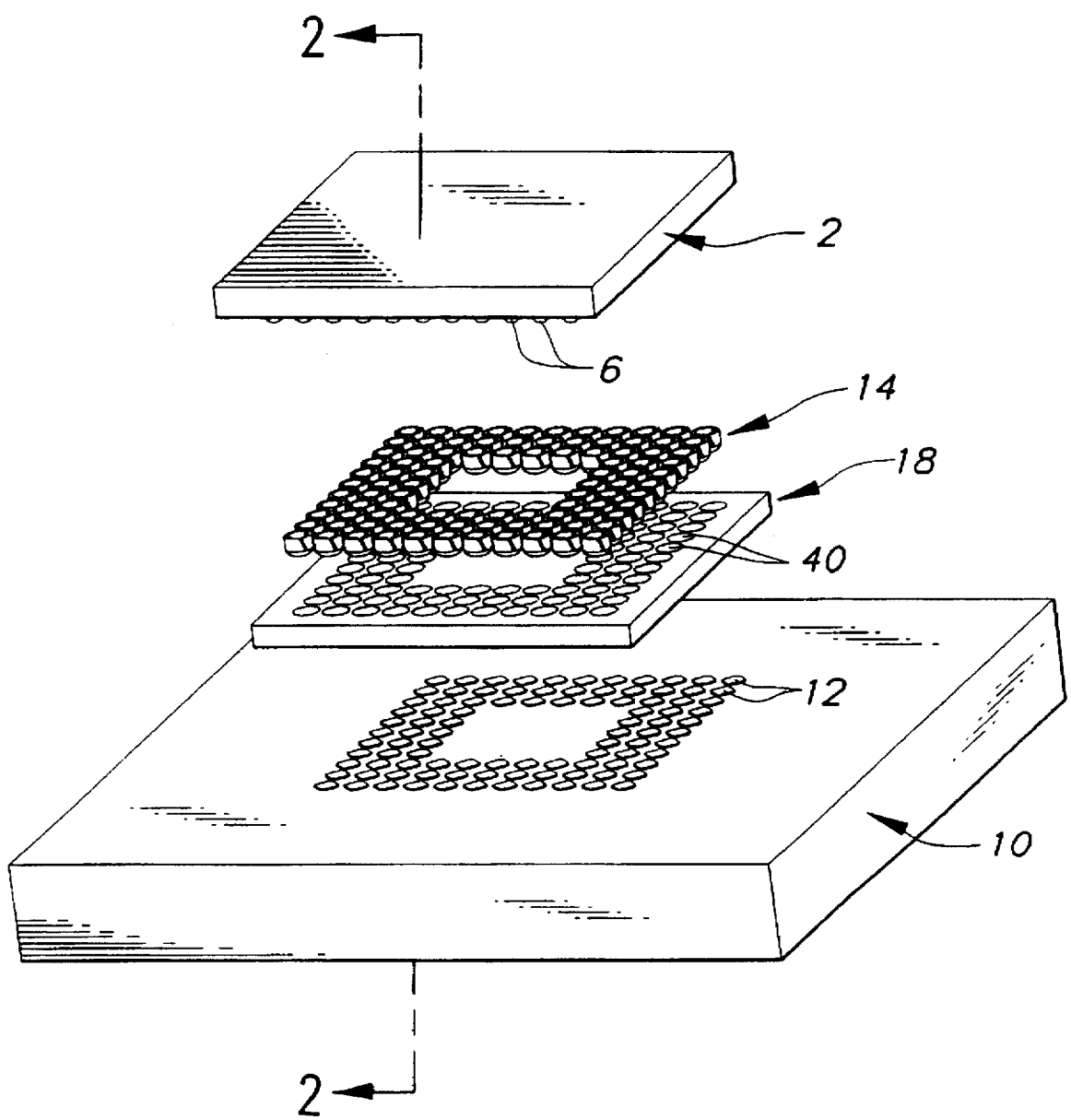
FIG. 1 is an exploded perspective view showing a substrate and a printed circuit board prior to socket contacts being soldered thereto.
Figure 2:
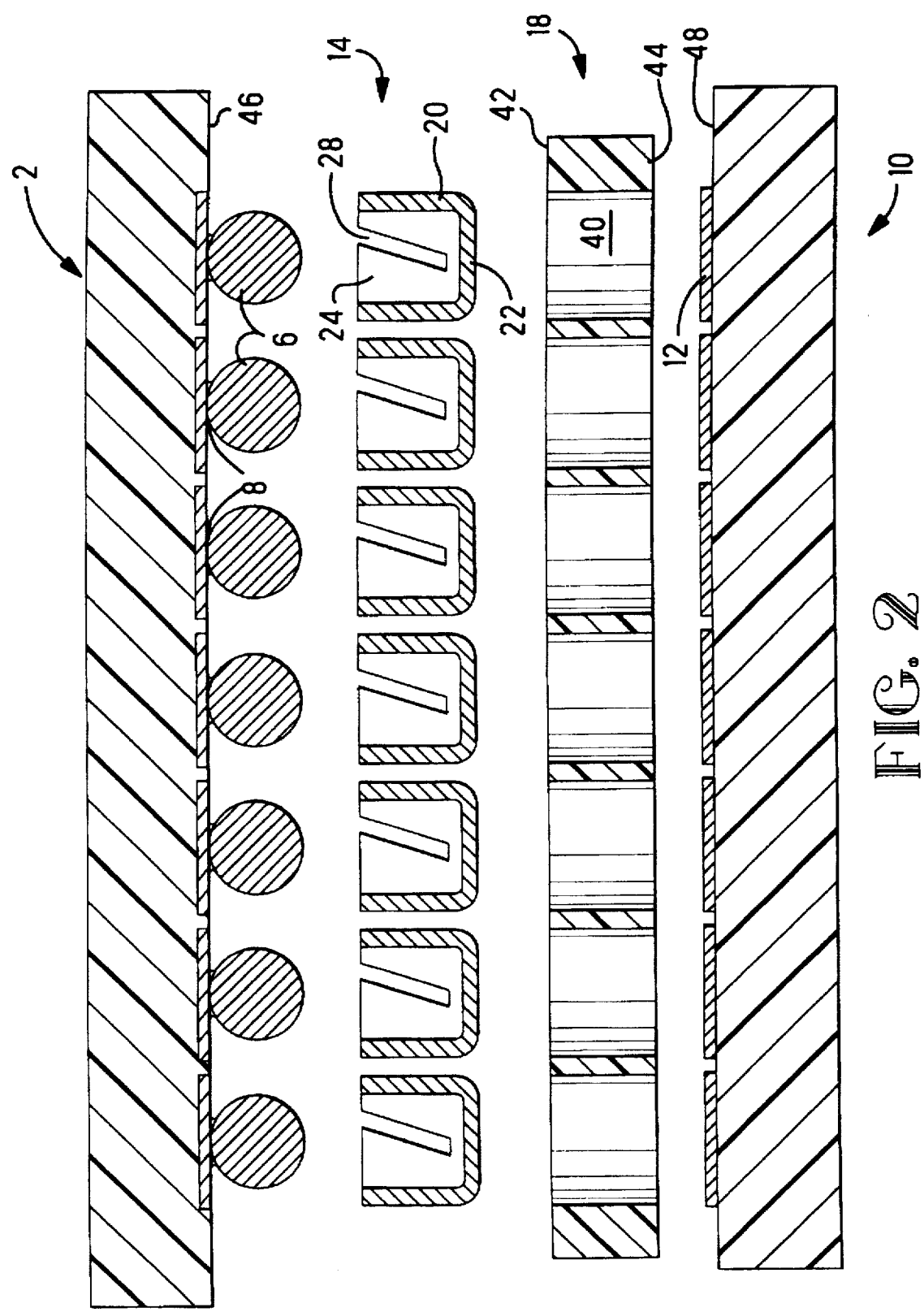
FIG. 2 is a cross sectional view taken along line 2—2 of FIG. 1.

As shown in FIGS. 1 and 2, a substrate 2, made from a ceramic or other material, has a plurality of balls 6 mounted to circuit pads 4 provided on a surface thereof. The balls 6 are maintained in position on the circuit pads 4 by means of solder or brazing 8. It is worth noting that the balls 6 can be made of any conductive material which has the particular characteristics required for the particular application.

Figure 3:
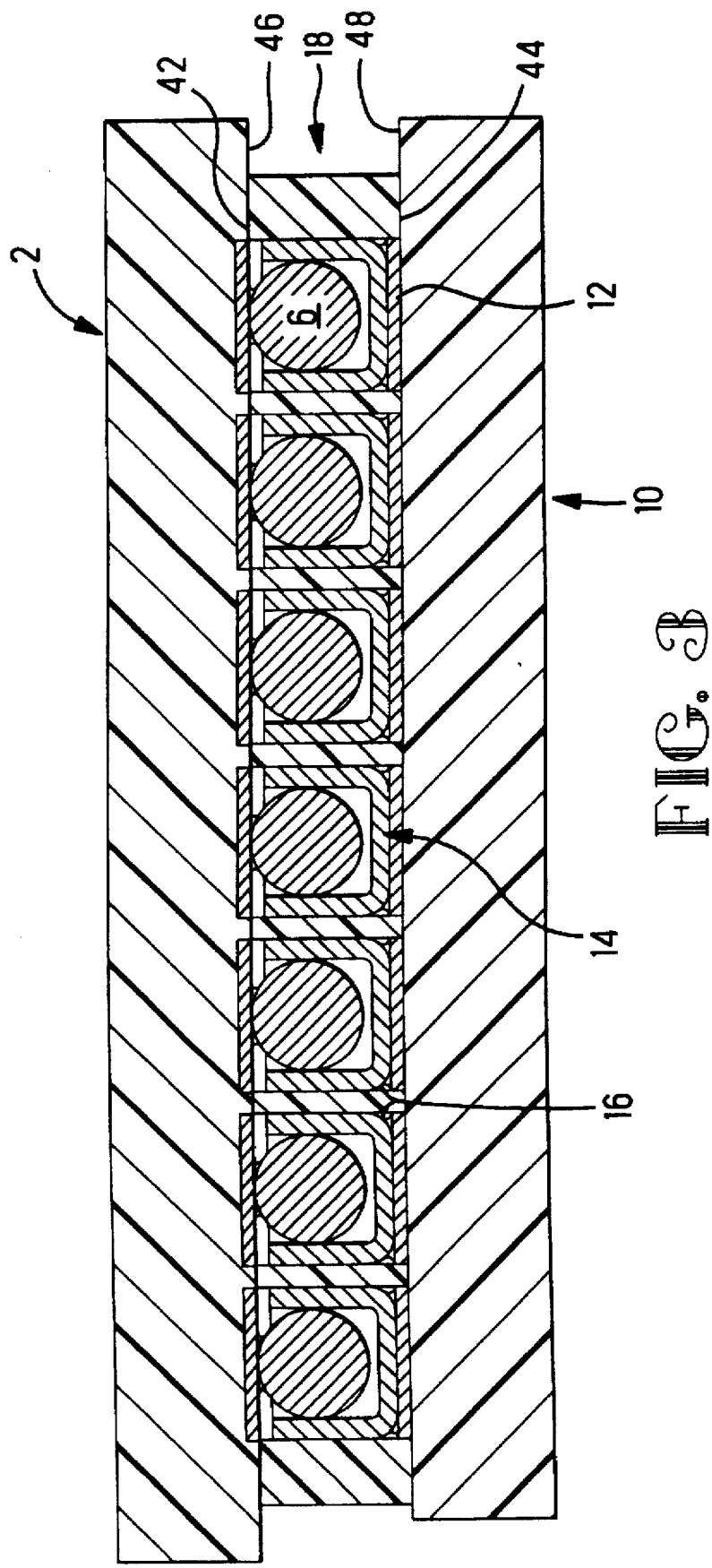
FIG. 3 is a cross sectional view, similar to FIG. 2, showing the substrate mated to the printed circuit board.

As will be further discussed, the substrate 2 is placed in electrical engagement with a printed circuit board 10 having copper traces and pads 12 provided thereon. As shown in FIG. 2, socket contacts 14 are positioned on the pads 12. The socket contacts 14 are maintained on the pads 12 by means of solder or brazing 16 (FIG. 3). A plastic carrier/spacer 18 is provided proximate the socket contacts 14. In some applications, the plastic carrier 18 may be removed after soldering.

The socket contacts 14 are made from a laminate material, wherein the inside of the socket contact 14 will be of stainless steel or similar material, the core will be of copper or the like, and the outside surface, which is soldered to the substrate 2, will be of tin or lead/tin. Depending on the material used to form the ball 6, the socket contacts 14 may be made from other suitable materials such as copper alloys, nickel alloys, palladium alloys, or gold overplate.

Figure 4:
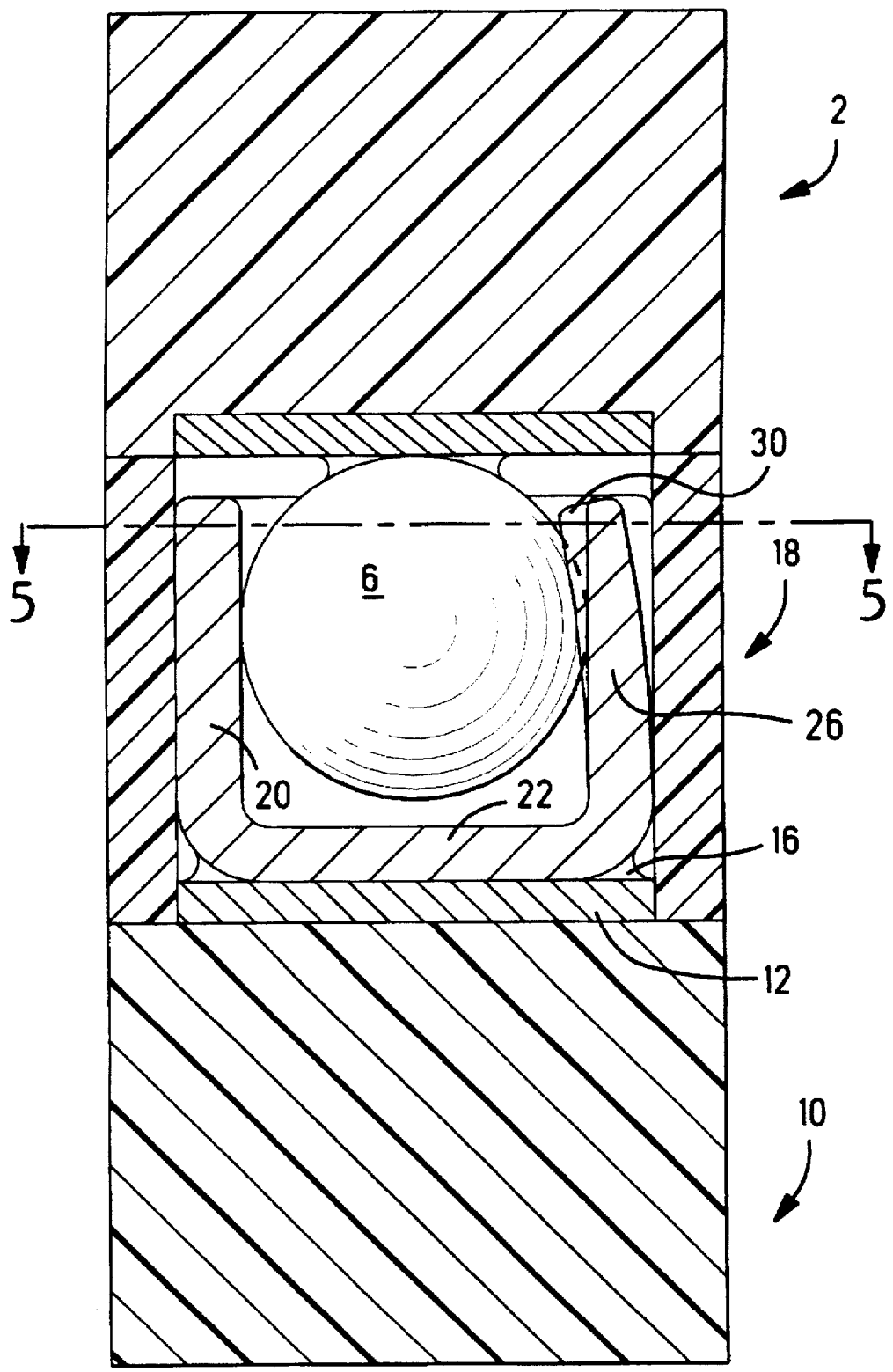
FIG. 4 is an enlarged cross sectional view of a respective socket contact, shown in FIG. 3, with a ball positioned therein.
Figure 5:
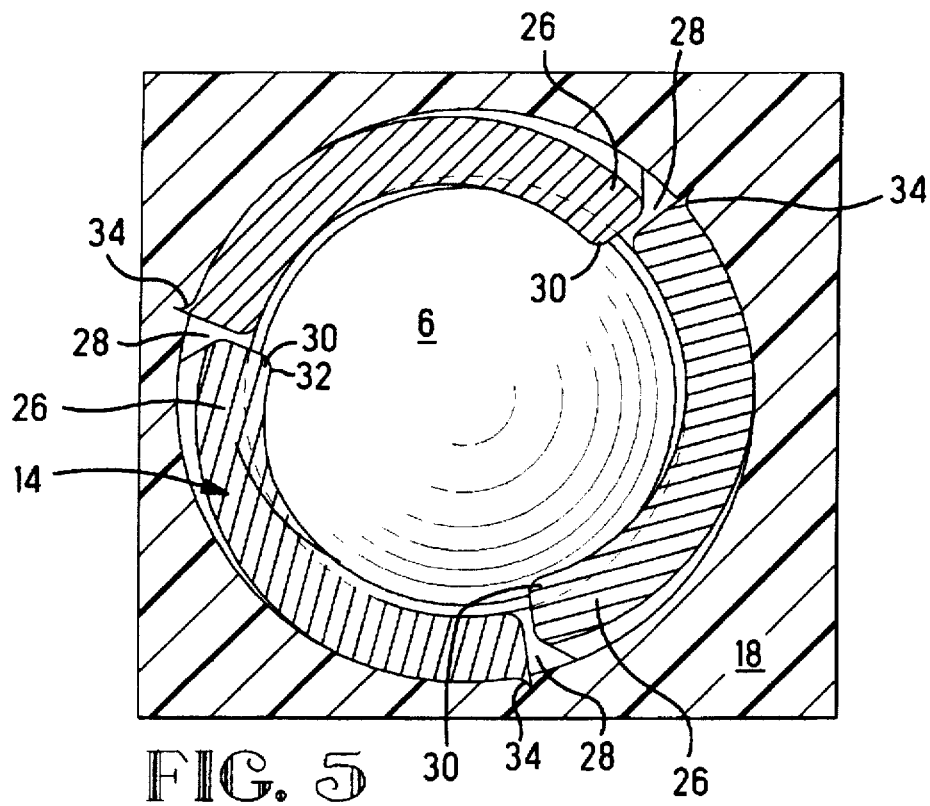
FIG. 5 is a cross sectional view taken along line 5—5 of FIG. 4 showing resilient arms of the socket contact in engagement with the ball.
Figure 6:
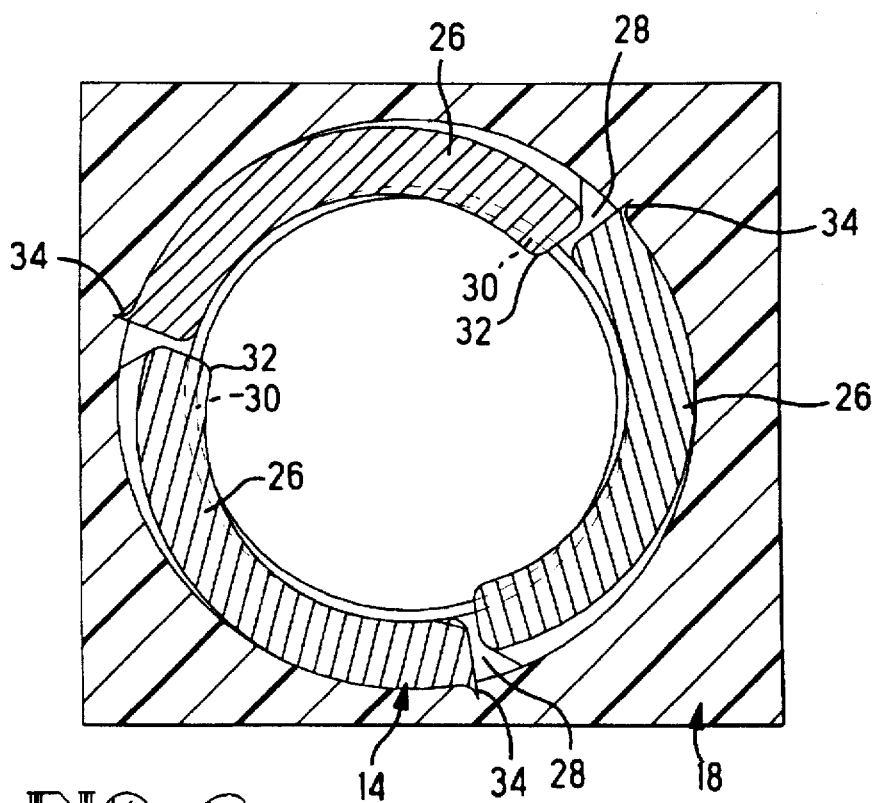
FIG. 6 is a cross sectional view, similar to that of FIG. 5, showing the resilient arms with no ball positioned in the socket contact.

As is shown in FIGS. 1 through 6, each socket contact 14 has a bottom wall 22 and side wall 20. The side wall 20 extends essentially perpendicular to the bottom wall 22 to form a ball receiving opening 24. Referring to FIGS. 4–6, the side wall 20 has resilient arms 26 provided therein. In the configuration shown, three arms 26 are provided on each socket contact 14. The resilient arms 26 are spaced from each other by slots 28. Each resilient arm 26 has a ball retention point 30 provided at one end thereof and may have a plastic carrier retention barb 34 provided at the other end. The contact area 32 is positioned proximate the ball retention point 30. Various other configurations of the socket contact (several of which are shown in FIGS. 6 through 18) may be used to accomplish the object of the invention.

As shown in FIGS. 2 and 3, in order to properly position the socket contacts 14 on the pads 12, the socket contacts 14 must be maintained in proper position prior to soldering. The plastic carrier 18 performs this function. The individual socket contacts 14 are loaded into the openings 40 of the plastic carrier 18. The openings 40 are cylindrical in configuration, with the diameter of each opening dimensioned to be slightly larger than the outer diameter of each socket contact 14. The plastic carrier retention barbs 34 (FIG. 5) of the socket contacts 14 dig into the sides of openings 40 to provide an interference fit which maintains the socket contacts 14 in the plastic carrier 18. The sides of the openings 40 of the plastic carrier 18 surround the side walls 20 of the socket contacts 14, such that the sides of the openings are proximate the side walls 20. This dimensioning allows the sides of the opening 40 to act as an overstress limiter for the resilient arms 26. The positioning of the sides of the openings 40 prevents the resilient arms 26 from bulging outwardly away from the receiving opening 24, thereby preventing the resilient arms 26 from overstressing and taking a permanent set.

With the socket contacts 14 properly loaded in the plastic carrier 18, the carrier 18 is moved into position relative to the circuit board 10. With the socket contacts 14 aligned with the traces 12, the socket contacts 14 are soldered to the traces 12.

The substrate 2 with the balls 6 attached thereto is moved into alignment with the printed circuit board 10 with the socket contacts 14 soldered thereto. The plastic carrier 18 is retained on the assembled printed circuit board 10 due to the cooperation of the barbs 34 with the carrier 18, as was previously discussed.

The substrate 2 and the printed circuit board 10 are then moved toward each other, causing the balls 6 to move into respective ball receiving openings 24 of the socket contacts 14. As the balls 6 are moved into the openings 24, the balls 6 engage the ball retention points 30 (FIG. 4) of the socket contacts 14. As the mating continues, the balls 6 will resiliently deflect the arms 26 outwardly. The arms 26 are configured to allow for the resilient deflection thereof, however, the deformation occurs in the elastic range so that the arms 26 attempt to return to their original unstressed position.

As the resilient arms 26 are moved outwardly, the arms 26 exert forces on the balls 6. This force is sufficient for the ball retention points 30 to scrape the surfaces of the balls, thereby causing the ball retention points 30 to penetrate any oxides or the like which are present on the surface of the balls 6 and ensuring that a positive electrical connection is provided between the balls 6 and the contact areas 32 of the arms 26.

As shown in FIGS. 2 and 3, the mating of the substrate 2 and the circuit board 10 continues until the top surface 42 of the plastic carrier 18 engages the bottom surface 46 of the substrate 2 and the bottom surface 44 of the plastic carrier 18 engages the top surface 48 of the printed circuit board 10. In this position, the substrate 2 and the printed circuit board 10 are spaced from each other and cannot move closer to each other. The assembly is maintained in this position due to the cooperation of the balls 6 with the resilient arms 26 of the socket contacts 14. As best shown in FIGS. 4–6, the resilient arms 26 attempt to return toward the unstressed position but stop at a new stressed position when the balls are fully inserted. In this position, the resilient arms 26 cooperate with the curvature of the balls 6 to exert a downward force on the balls 6 to ensure that the balls 6 are maintained in position. This force is sufficient to maintain the substrate 2 in a fully mated position relative to the printed circuit board 10, thereby ensuring that a proper electrical connection is provided therebetween.

The use of the plastic carrier or spacer 18 ensures that the ball 6 will not engage the bottom wall 22 of the socket contact 14. This prevents the ball 6 from being damaged by the bottom wall 22.

The use of the ball 6 and socket contact 14 allow the substrate 2 to be removably mounted to the printed circuit board 10. This "pin and socket" type termination allows for the substrate 2 to be removed from the printed circuit board 10 as needed. The removability allows for such things as burn in type testing, repair and replacement, and other similar options. As the balls 6 are removable from the socket contacts 14 and may contain tin, it is important to make the socket contacts 14 of a material which does not have an affinity for tin on the surfaces which engage the balls 6. If a small amount of tin is transferred to the inside surface of the socket contacts 14 and the balls 6 are unplugged or removed, the thin film of tin will convert to a tin oxide, which is of high resistance or even an insulator material, thereby reducing the possibility of making a proper electrical connection during future matings.

The use of socket contacts 14 also permits for the lateral displacement of the balls 6 induced by the expansion of the package caused by power cycling to yield elastically and the arms 26 will follow the ball's 6 trajectory of expansion and contraction.

FIGS. 7 through 18 illustrate alternative embodiments of the socket contact 14. These embodiments operate in a similar manner to that described above, however, the retention points are slightly different. For ease of explanation and understanding, the same references numbers as above with the appropriate number of prime marks will be used.

Figure 7:
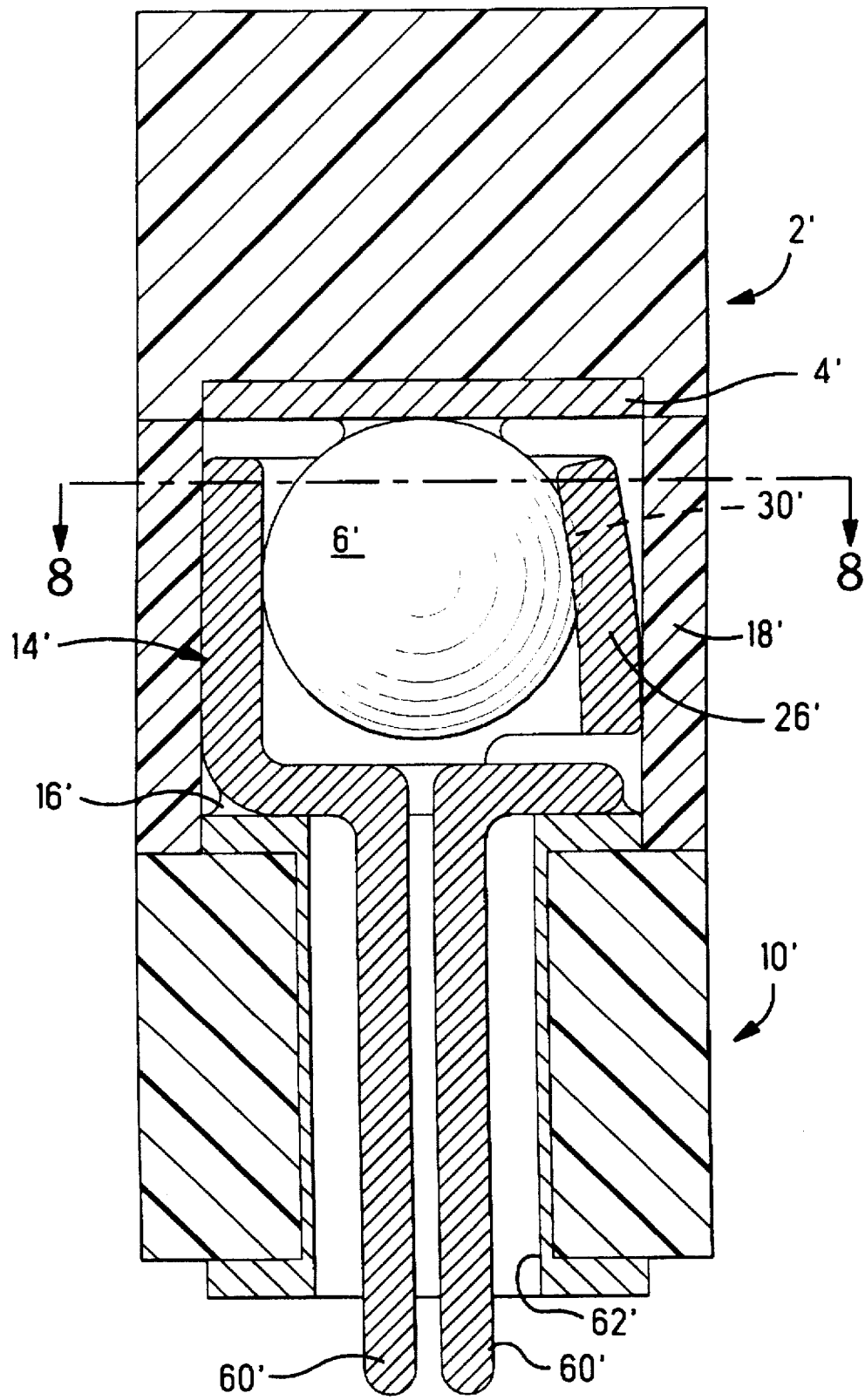
FIG. 7 is a cross sectional view, similar to that of FIG. 4, of a first alternate socket contact with a ball positioned therein.
Figure 8:
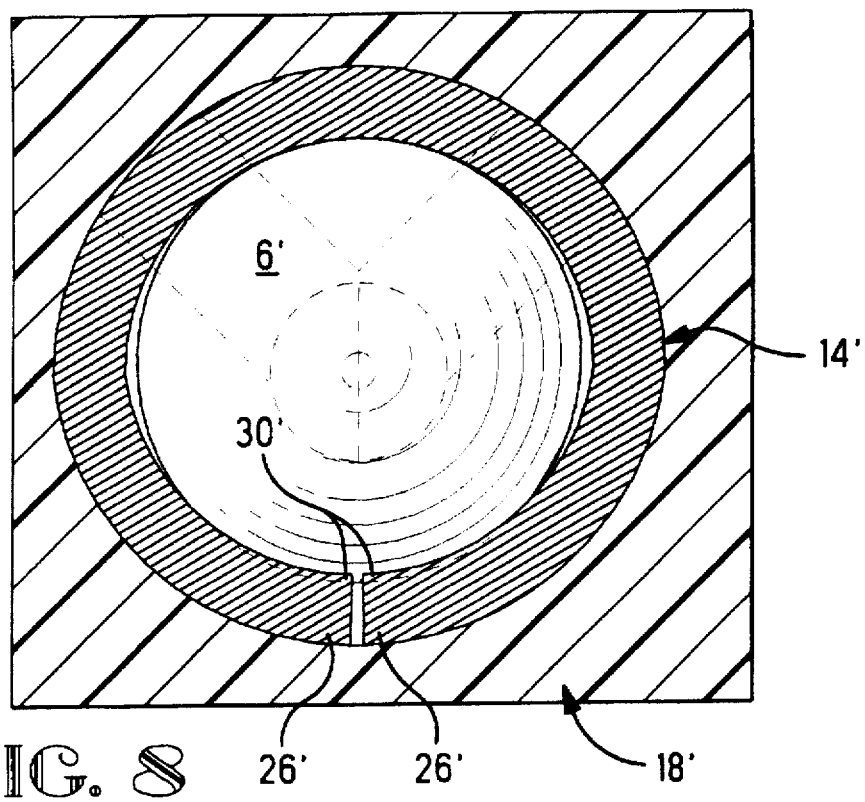
FIG. 8 is a cross sectional view, taken along line 8—8 of FIG. 7, showing the resilient arms of the first alternate socket contact in engagement with the ball.

The socket contact 14' shown in FIGS. 7 and 8 is stamped and formed from flat stock. The resilient arms 26' cooperate with the ball 6' as was previously discussed. As best shown in FIG. 7, the socket contact 14' has legs 60' which extend into through holes 62' of printed circuit board 10'. The legs 60' are soldered in place in the conventional manner. The socket contact 14' in this configuration is held in place on the plastic spacer 18' by means of a frictional engagement therebetween.

Figure 10:
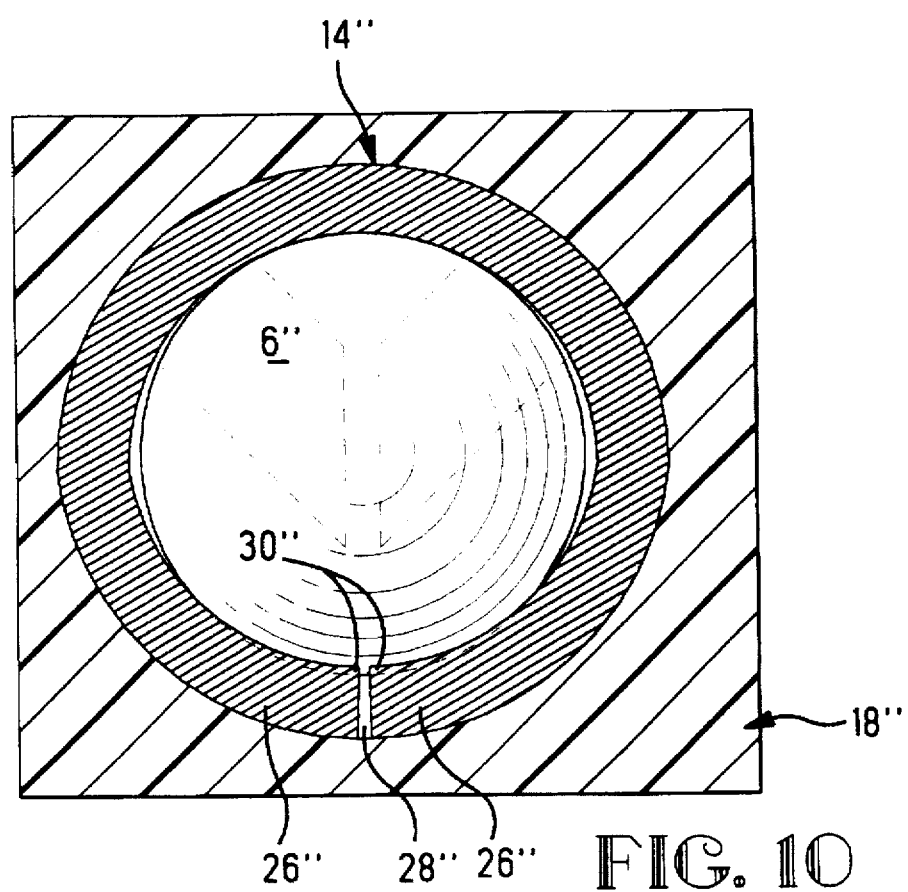
FIG. 10 is a cross sectional view, taken along line 10—10 of FIG. 9, showing the resilient arms of the second alternate socket contact in engagement with the ball.
Figure 9:
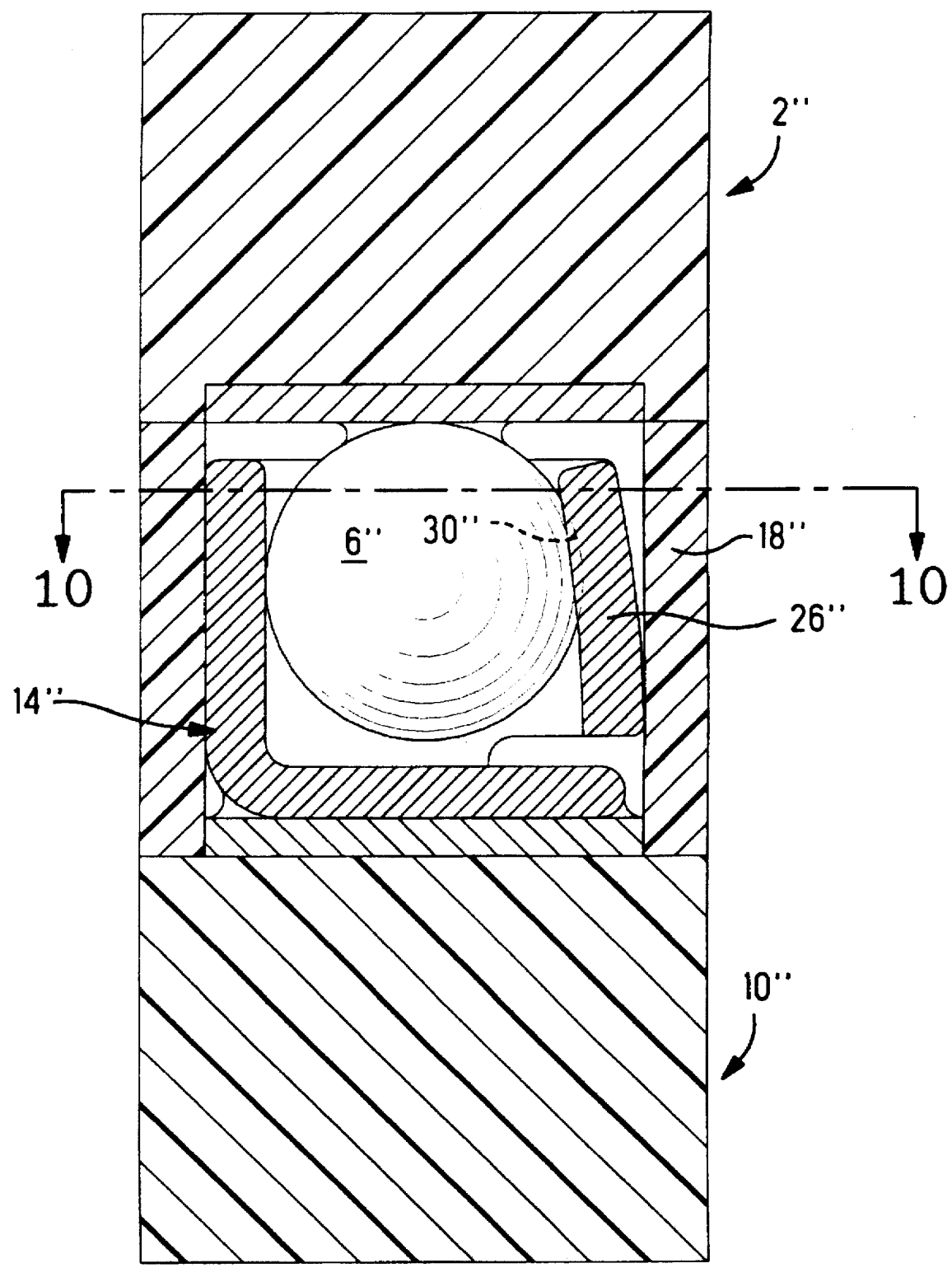
FIG. 9 is a cross sectional view, similar to that of FIG. 4, of a second alternate socket contact with a ball positioned therein.

FIGS. 9 and 10 illustrate a socket contact 14" in which the upper portion is identical to socket contact 14'. However, socket contact 14" is surface mounted to printed circuit board 10".

Figure 11:
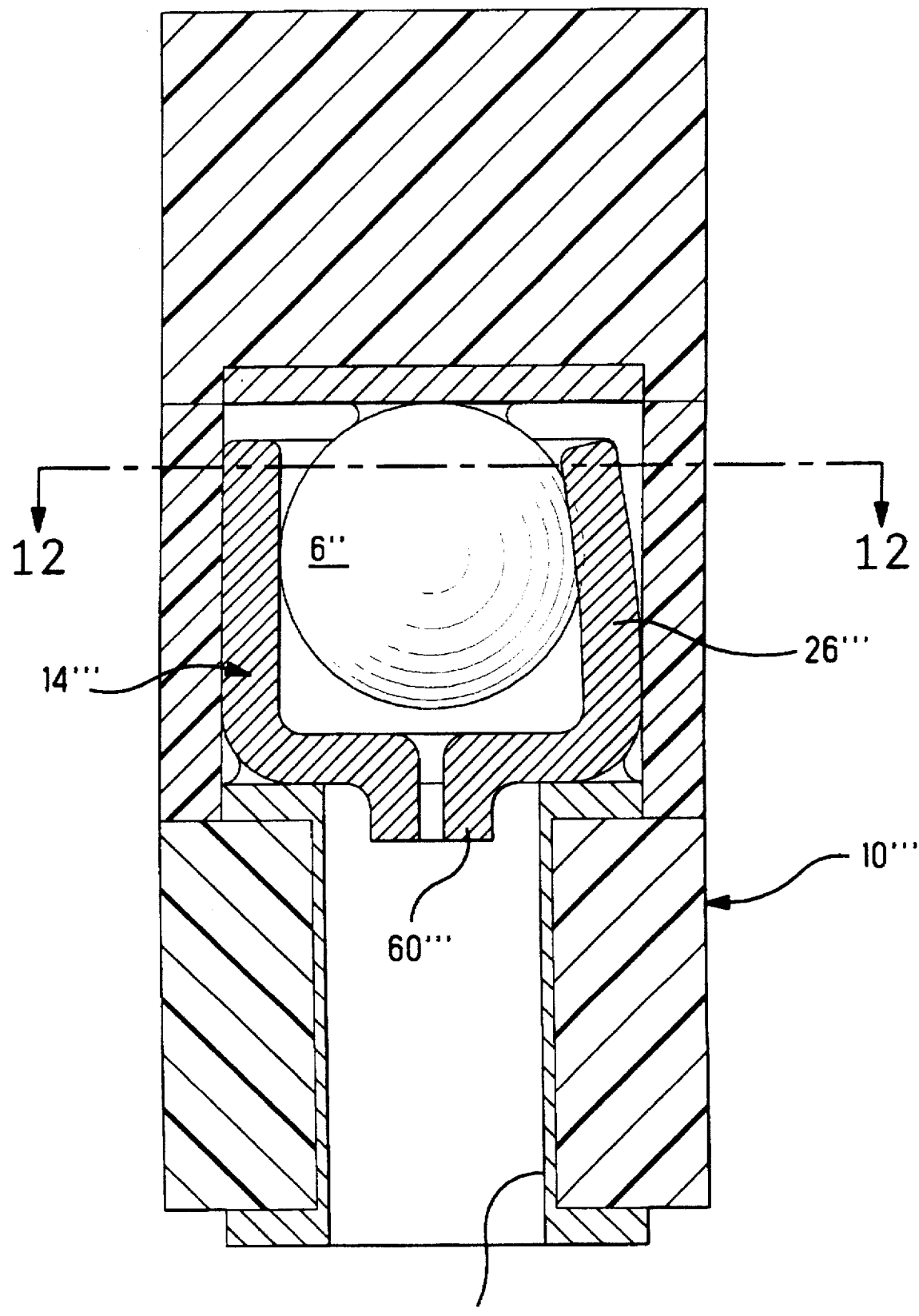
FIG. 11 is a cross sectional view, similar to that of FIG. 4, of a third alternate socket contact with a ball positioned therein.
Figure 16:
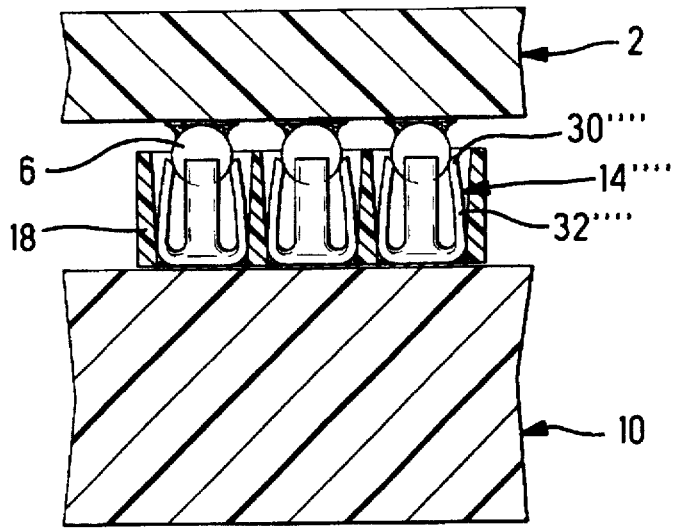
FIGS. 16–18 are a progression of side views showing a substrate being mated to a printed circuit board having socket contacts of the fourth embodiment.

FIG. 11 and 12 are directed to a drawn socket contact 14'41 in which the bottom is pierced to provide a positioning member 60'" which helps to center the socket 14'" in the through hole 62'" of the printed circuit board 10'".

FIGS. 13–18 illustrate a socket contact 14'" having a plurality of resilient arms 26'" which contact and retain the balls 6.

Figure 17:
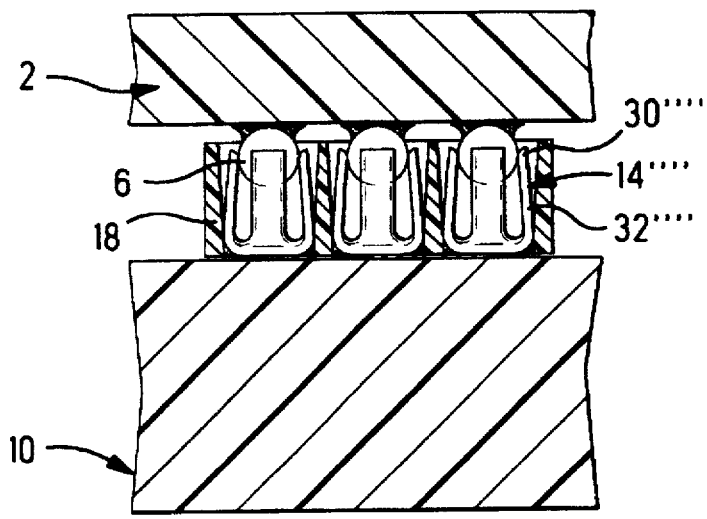
Figure 18:
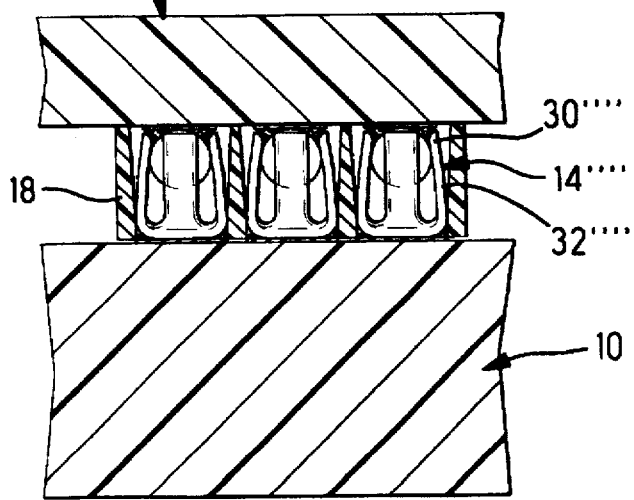

These socket contacts 14"" are loaded into the plastic carrier 18 as in the previous embodiments. A ball contact 6 is matable with the socket contact 14"" and is drawn into the socket contact 14"" when in the fully mated position as shown in FIG. 18. As shown in FIG. 17, the ball 6 will be drawn into the socket contacts 14"" once the ball 6 is urged into the socket contact 14"" such that its widest portion passes the ball retention points 30"" of the socket contact 14"". Since the diameter of the opening 24"" formed by the resilient arms 26"" is smaller than the diameter of the ball 6, a sufficient mating force is required to urge the arms 26"" apart from each other to accept the ball 6. Once the ball 6 is sufficiently inserted into the socket contact 14"" such that the ball retention points 30"" are touching past the maximum diameter of the ball contact 6, the resilient arms 26"" will tend to resile back toward their original unstressed position thus drawing the ball 6 into the receptacle contact 14"". Electrical connection between the socket contact 14"" and the ball 6 is then maintained at the contact point 32"".

The invention illustrated by the embodiments is important because, as the complexity of the circuit boards increase, the number of power and ground interconnections also increases. Thus, the need for packages accommodating a thousand or more interconnections, even for a single chip, is rapidly becoming a reality. The use of the balls meets these requirements. The balls are easily located accurately with an aperture plate and require no orientational positioning, thereby providing an inherently low cost solution. Whether these balls are made from solder, or any other material, these benefits prevail.

The balls described above may be made of solder for small packages. However, for larger packages, hard balls utilizing spring tempered metal may be used. The metal can be plated with various substances such as gold or gold over nickel.

The socketing of the balls is advantageous as it allows for sufficient compliance to accommodate power cycling induced displacement without overstressing the solder connections. The material used in the socket and ball allow the electromagnetic properties of the socket to be indistinguishable from the balls alone. Changes in construction will occur to those skilled in the art and various apparently different modifications and embodiments may be made without departing from the scope of the invention. The matter set forth in the foregoing description and accompanying drawings is offered by way of illustration only. It is therefor intended that the foregoing description be regarded as illustrative rather than limiting.

I claim:

1. An electrical connection system for electrically connecting a first substrate to a second substrate comprising:

at least one ball contact disposed on a major surface of the first substrate, and;

at least one socket contact mountable on a major surface of the second substrate to receive the ball contact, the socket contact having a bottom wall, a side wall extending from the bottom wall in a direction toward a mating end and essentially perpendicular to the bottom wall, the side wall forming an opening into which the ball contact is inserted, and at least one contact retention point provided on the side wall proximate the mating end and extending into the opening, the contact retention point cooperating with the ball contact to draw the ball contact into engagement with the socket contact during mating as the contact retention points pass over the ball contact.

2. A socket contact as recited in claim 1 wherein the socket contact is stamped and formed from flat stock.

3. A socket contact as recited in claim 1 wherein carrier retention points are provided on the side wall and extend in a direction away from the opening, the carrier retention points cooperate with a carrier to maintain the socket contacts therein.

4. A socket contact as recited in claim 1 wherein the contact retention points are provided on resilient arms, the resilient arms are configured to allow for the elastic deflection thereof as the ball contact is brought into engagement with the socket contact.

5. A socket contact as recited in claim 1 wherein the socket contact is a laminate material, the inside layer of the laminate material is a material which does not have an affinity for tin.

6. A socket contact as recited in claim 5 wherein the laminate has an inside surface of stainless steel.

7. A socket contact as recited in claim 5 wherein the outside surface of the laminate is tin.

8. A socket contact as recited in claim 1 wherein the socket contact is a spring tempered metal.

9. A socket contact as recited in claim 8 wherein the spring tempered metal is gold plated.

10. A socket contact as recited in claim 8 wherein the spring tempered metal has a layer of nickel plating and a layer of gold plating.

11. A socket contact as recited in claim 8 wherein the spring tempered metal has a layer of palladium plating and a layer of gold plating.

12. A socket contact as recited in claim 8 wherein the spring tempered metal has a layer of nickel plating and a layer of palladium plating.

13. A socket contact being mountable on a substrate and matable with a ball contact comprising:

contact retention points disposed on resilient arms extending substantially perpendicular to a bottom wall, the contact retention points extend into an opening defined by the resilient arms, the resilient arms being configured to allow for the elastic deflection thereof as a mating ball contact is brought into engagement with the socket contact, such that when the mating ball contact is fully inserted, the resilient arms will return toward an unstressed position to cooperate with the periphery of the mating ball contact to maintain the mating ball contact in position.

14. A socket contact as recited in claim 13 wherein the socket contact is a spring temper metal.

15. A socket contact as recited in claim 13 wherein the socket contact is a laminate material, the inside layer of the laminate material is a material which does not have an affinity for tin.

16. A socket contact as recited in claim 15 wherein the laminate has an inside surface of stainless steel.

17. A substrate mating assembly comprising:

a first substrate with at least one mating contact mounted thereon, the at least one mating contact having an arcuate surface and dimensioned to be received in a contact receiving opening of at least one socket contact, a second substrate with the at least one socket contact mounted thereon, the at least one socket contact having contact retention points disposed on resilient arms extending into a contact receiving opening thereof, the resilient arms are configured to allow for the elastic deflection thereof as the at least one mating contact is brought into engagement with the at least one socket contact, such that when the at least one mating contact is fully inserted, the resilient arms will return toward an unstressed position to cooperate with the arcuate surface of the at least one mating contact.

18. An assembly as recited in claim 17 wherein the mating contact is a conductive ball.

19. An assembly as recited in claim 17 wherein the mating contact is surface mounted to the second substrate and the socket contact is surface mounted to the first substrate.

20. An assembly as recited in claim 17 wherein the contact retention points are provided on resilient arms, the resilient arms are configured to allow for the elastic deflection thereof as the at least one mating contact is brought into engagement with the at least one socket contact, such that when the at least one mating contact is fully inserted, the resilient arms will return toward an unstressed position to cooperate with the arcuate surface of the at least one mating contact to maintain the at least one mating contact in position.

21. An assembly as recited in claim 17 wherein a carrier is provided between the first substrate and the second substrate to maintain the spacing therebetween, the carrier has socket contact receiving openings provided therein to cooperate with the at least one socket contact.

22. An assembly as recited in claim 21 wherein carrier retention points are provided on the at least one socket contact and extend in a direction away from the contact receiving opening, the carrier retention points cooperate with the carrier to maintain the at least one socket contact in the socket contact receiving openings.

23. An assembly as recited in claim 22 wherein the contact retention points of the at least one socket contact are provided on resilient arms.

24. An assembly as recited in claim 23 wherein contact receiving openings are configured to be overstress protection members, whereby as the at least one mating contact is moved into the at least one socket contact, the resilient arms will not be overstressed.

25. A socket assembly for establishing an electrical connection to a ball contact comprising:

a socket being mountable on a substrate at a bottom wall and having contact retention points disposed on resilient arms extending from the bottom wall, the contact retention points extend into an opening defined by the resilient arms, the resilient arms being configured to allow for the elastic distortion thereof as a mating ball contact is brought into engagement with socket, such that when the mating ball contact is fully inserted, the resilient arms will return toward an unstressed position to cooperate with the periphery of the mating ball contact to maintain the mating ball contact in position.

26. A socket assembly as recited in claim 25 wherein the mating contact is surface mounted to the second substrate and the socket is surface mounted to the first substrate.

27. A socket assembly as recited in claim 25 wherein the socket is a laminate material, the inside layer of the laminate material is a material which does not have an affinity for tin.

28. A socket assembly as recited in claim 25 wherein the laminate has an inside surface of stainless steel.

29. A socket assembly as recited in claim 25 wherein the socket is a spring temper metal.

* * * * *